(12) United States Patent
Sato et al.

(10) Patent No.: US 8,779,059 B2
(45) Date of Patent: Jul. 15, 2014

(54) OPTICAL SEMICONDUCTOR SEALING RESIN COMPOSITION AND OPTICAL SEMICONDUCTOR DEVICE USING SAME

(75) Inventors: Atsushi Sato, Ohtake (JP); Hiroyuki Hirakawa, Ohtake (JP)

(73) Assignee: Daicel Chemical Industries, Ltd., Osaka-Shi (JP)

( * ) Notice: Subject to any disclaimer, the term of this patent is extended or adjusted under 35 U.S.C. 154(b) by 272 days.

(21) Appl. No.: 13/002,951

(22) PCT Filed: Jul. 22, 2009

(86) PCT No.: PCT/JP2009/003426
§ 371 (c)(1),
(2), (4) Date: Jan. 6, 2011

(87) PCT Pub. No.: WO2010/013407
PCT Pub. Date: Feb. 4, 2010

(65) Prior Publication Data
US 2011/0114972 A1    May 19, 2011

(30) Foreign Application Priority Data

Jul. 31, 2008  (JP) .................................. 2008-197469

(51) Int. Cl.
*C08L 63/00* (2006.01)
*H01L 23/29* (2006.01)

(52) U.S. Cl.
USPC ............................................ 525/65; 257/793

(58) Field of Classification Search
None
See application file for complete search history.

(56) References Cited

U.S. PATENT DOCUMENTS

| | | | |
|---|---|---|---|
| 5,789,482 A * | 8/1998 | Eldin et al. | 525/65 |
| 6,037,392 A * | 3/2000 | Tang et al. | 523/201 |
| 7,919,555 B2 * | 4/2011 | Agarwal et al. | 524/500 |
| 2006/0022790 A1 * | 2/2006 | Mori et al. | 338/22 R |
| 2007/0027233 A1 | 2/2007 | Yamaguchi et al. | |
| 2007/0027263 A1 | 2/2007 | Furukawa et al. | |
| 2007/0251419 A1 | 11/2007 | Yamaguchi et al. | |
| 2011/0036497 A1 * | 2/2011 | Lammerschop et al. | 156/330 |

FOREIGN PATENT DOCUMENTS

| | | |
|---|---|---|
| CN | 1798805 A | 7/2006 |
| EP | 1 666 519 A1 | 6/2006 |
| EP | 1 780 239 A1 | 5/2007 |
| JP | 7-41544 A | 2/1995 |
| JP | 9-255764 A | 9/1997 |
| JP | 11-240939 A | 9/1999 |
| JP | 2005-255822 A | 9/2005 |
| JP | 2007-320974 A | 12/2007 |
| JP | 2008-189709 A | 8/2008 |
| WO | WO 2005/028546 A1 | 3/2005 |
| WO | WO 2006/019041 A1 | 2/2006 |
| WO | WO 2006/064736 A1 * | 6/2006 |

OTHER PUBLICATIONS

International Search Report, dated Oct. 13, 2009 issued in PCT/JP2009/003426.

\* cited by examiner

*Primary Examiner* — Robert Sellers
(74) *Attorney, Agent, or Firm* — Birch, Stewart, Kolasch & Birch, LLP

(57) ABSTRACT

An optical semiconductor sealing resin composition includes a rubber-particle-dispersed epoxy resin (A) containing an alicyclic epoxy resin and, dispersed therein, rubber particles, in which the rubber particles comprise a polymer including one or more (meth)acrylic esters as essential monomeric components and have a hydroxyl group and/or a carboxyl group in a surface layer thereof as a functional group capable of reacting with the alicyclic epoxy resin, the rubber particles have an average particle diameter of 10 nm to 500 nm and a maximum particle diameter of 50 nm to 1000 nm, and the difference in refractive index between the rubber particles and a cured article obtained from the optical semiconductor sealing resin composition is within ±0.02. The optical semiconductor sealing resin composition can give a cured article which exhibits excellent cracking resistance while maintaining satisfactory thermal stability and high transparency.

8 Claims, No Drawings

OPTICAL SEMICONDUCTOR SEALING RESIN COMPOSITION AND OPTICAL SEMICONDUCTOR DEVICE USING SAME

TECHNICAL FIELD

The present invention relates to an optical semiconductor sealing resin composition, and an optical semiconductor device including one or more optical semiconductor elements sealed with the resin composition. The optical semiconductor sealing resin composition according to the present invention gives, through curing, a cured article excellent in thermal stability (heat resistance), transparency, and cracking resistance.

BACKGROUND ART

Light-emitting devices or apparatuses such as optical semiconductor devices are practically used typically in indoor or outdoor display boards, light sources for image reading, traffic signals, and large-screen displays, in which emitters and surroundings thereof are protected by sealing mainly with epoxy resins. Exemplary epoxy resins which have been widely used as the sealants (encapsulants) include aromatic epoxy resins having a bisphenol-A skeleton.

Recent technical advances allow light emitting diode (LED) displays to have dramatically higher outputs and to emit further bluer or whiter light. This allows light emission with high output at relatively short wavelengths. When the aromatic epoxy resins, however, are used for sealing of the light emitting diode displays, their aromatic rings absorb light with such a short wavelength, and this causes the resins to deteriorate and to turn to yellow and thereby causes luminance degradation and discoloration.

Known as epoxy resins having satisfactory transparency and thermal stability are liquid alicyclic epoxy resins having an alicyclic skeleton such as 3,4-epoxycyclohexylmethyl 3',4'-epoxycyclohexanecarboxylate, an adduct of 3,4-epoxycyclohexylmethyl 3',4'-epoxycyclohexanecarboxylate and ε-caprolactone, or 1,2,8,9-diepoxylimonene. Cured articles obtained from these alicyclic epoxy resins, however, are susceptible to various stress and are poor in thermal shock resistance (cracking resistance) so that they are, for example, susceptible to cracking as a result of repeated temperature cycles (repeating heating and cooling procedures). Accordingly, they hardly ensure reliability typically of resulting electronic components.

As a possible solution to improve cracking resistance, there is known the use of an epoxy resin composition containing diglycidyl ether of nucleus-hydrogenated bisphenol-A for sealing of optical semiconductor devices (Patent Literature (PTL) 1). However, a cured article obtained from the epoxy resin composition has problems typically in coloring, weather resistance, and thermal stability. PTL 2 describes a technique for imparting high toughness to an epoxy resin by dispersing a core-shell polymer in the epoxy resin. However, this literature does not make mention of the transparency of the cured article obtained from the epoxy resin. Independently, there is known a technique of compounding a polyether polyol in an epoxy resin, and dispersing particles in the epoxy resin, which particles have a core structure composed of a butadiene rubber, and a shell structure composed of a methyl methacrylate resin (PTL 3). However, the cured article therefrom is not satisfactory in transparency, because the particles used in the resin have a butadiene rubber core structure. Specifically, under present circumstances, there is found no optical semiconductor sealing resin composition which gives a cured article that can exhibit excellent cracking resistance while maintaining satisfactory thermal stability and high transparency.

CITATION LIST

Patent Literature

PTL 1: Japanese Unexamined Patent Application Publication (JP-A) No. H09(1997)-255764
PTL 2: Japanese Unexamined Patent Application Publication (JP-A) No. 2005-255822
PTL 3: Japanese Unexamined Patent Application Publication (JP-A) No. H11(1999)-240939

SUMMARY OF INVENTION

Technical Problem

Accordingly, an object of the present invention is to provide an optical semiconductor sealing resin composition which gives a cured article that exhibits excellent cracking resistance while maintaining satisfactory thermal stability and high transparency.

Another object of the present invention is to provide an optical semiconductor device including an optical semiconductor element sealed with the optical semiconductor sealing resin composition.

Solution to Problem

After intensive investigations to achieve the objects, the present inventors have found that specific rubber particles, when dispersed in an alicyclic epoxy resin, do not impair transparency, which rubber particles each comprises one or more (meth)acrylic esters as essential monomeric components, have a hydroxyl group and/or a carboxyl group in a surface layer thereof as a functional group capable of reacting with the alicyclic epoxy resin, have specific particle diameters and a specific refractive index, and have a specific functional group in a surface layer thereof; and that the rubber particles having a core-shell structure do not cause a cured article obtained through curing of the alicyclic epoxy resin to have a significantly lower glass transition temperature, because the rubber component constituting the core does not dissolve into the alicyclic epoxy resin, and this allows the cured article to maintain high transparency and satisfactory thermal stability. The present inventors have further found that an optical semiconductor sealing resin composition containing a rubber-particle-dispersed epoxy resin containing an alicyclic epoxy resin and, dispersed therein, the rubber particles gives a cured article which can exhibit excellent cracking resistance. The present invention has been made based on these findings and further investigations.

Specifically, the present invention provides, in an embodiment, an optical semiconductor sealing resin composition comprising a rubber-particle-dispersed epoxy resin (A) containing an alicyclic epoxy resin and, dispersed therein, rubber particles, wherein the rubber particles comprise a polymer including one or more (meth)acrylic esters as essential monomeric components and have a hydroxyl group and/or a carboxyl group in a surface layer thereof as a functional group capable of reacting with the alicyclic epoxy resin, wherein the rubber particles have an average particle diameter of 10 nm to 500 nm and a maximum particle diameter of 50 nm to 1000 nm, and wherein a difference in refractive index between the rubber particles and a cured article obtained from the optical semiconductor sealing resin composition falls within ±0.02.

The optical semiconductor sealing resin composition may further contain a curing agent (B) and a curing accelerator (C) in addition to the rubber-particle-dispersed epoxy resin (A) and/or may further contain a curing catalyst (D) in addition to the rubber-particle-dispersed epoxy resin (A).

The curing agent (B) is preferably an acid anhydride which is in liquid form at 25° C.

The curing catalyst (D) is preferably one generating a cationic species upon irradiation with an ultraviolet ray or upon a heating treatment and thereby initiating polymerization of the rubber-particle-dispersed epoxy resin (A).

The optical semiconductor sealing resin composition preferably further includes a glycidyl ether epoxide having no aromatic ring and/or a polyol compound which is in liquid form at 25° C. (except polyether polyols).

The present invention further provides, in another embodiment, an optical semiconductor device which includes one or more optical semiconductor elements sealed with the optical semiconductor sealing resin composition.

Advantageous Effects of Invention

The optical semiconductor sealing resin composition according to the present invention includes a rubber-particle-dispersed epoxy resin (A) containing an alicyclic epoxy resin and, dispersed therein, rubber particles and uses, as the rubber particles, rubber particles which comprise a polymer containing one or more (meth)acrylic esters as essential monomeric components, which have a hydroxyl group and/or carboxyl group in a surface layer thereof as a functional group capable of reacting with the alicyclic epoxy resin, and which have an average particle diameter of 10 nm to 500 nm and a maximum particle diameter of 50 nm to 1000 nm, in which a difference in refractive index between the rubber particles and a cured article obtained from the optical semiconductor sealing resin composition falls within ±0.02. Accordingly, the rubber particles do not cause the rubber component to dissolve out from the particles and thereby do not cause the cured article obtained through curing of the optical semiconductor sealing resin composition to have a significantly lowered glass transition temperature. In addition, dispersion of the rubber particles does not impair the transparency of the cured article.

The optical semiconductor sealing resin composition containing the rubber-particle-dispersed epoxy resin (A) gives, through curing, a cured article which can exhibit excellent cracking resistance while maintaining satisfactory thermal stability and high transparency. The optical semiconductor sealing resin composition according to the present invention is advantageously usable in a wide variety of applications including uses as sealing materials for electric and electronic components relating to optical semiconductor devices. In particular, when the optical semiconductor sealing resin composition is used as a sealant for an optical semiconductor element, the resulting optical semiconductor device keeps on maintaining high performance for a long time and establishes high credibility (reliability) as an extended-life optical semiconductor device.

DESCRIPTION OF EMBODIMENTS

[Optical Semiconductor Sealing Resin Composition]

The optical semiconductor sealing resin composition according to the present invention includes a rubber-particle-dispersed epoxy resin (A) containing an alicyclic epoxy resin and, dispersed therein, rubber particles, in which the rubber particles comprise a polymer including one or more (meth)acrylic esters as essential monomeric components and have a hydroxyl group and/or a carboxyl group in a surface layer thereof as a functional group capable of reacting with the alicyclic epoxy resin, the rubber particles have an average particle diameter of 10 nm to 500 nm and a maximum particle diameter of 50 nm to 1000 nm, and a difference in refractive index between the rubber particles and a cured article obtained from the optical semiconductor sealing resin composition falls within ±0.02.

[Rubber-Particle-Dispersed Epoxy Resin (A)]

The rubber-particle-dispersed epoxy resin (A) for use in the present invention includes an alicyclic epoxy resin and rubber particles dispersed in the alicyclic epoxy resin, in which the rubber particles comprise a polymer including one or more (meth)acrylic esters as essential monomeric components and have a hydroxyl group and/or a carboxyl group in a surface layer thereof as a functional group capable of reacting with the alicyclic epoxy resin, the rubber particles have an average particle diameter of 10 nm to 500 nm and a maximum particle diameter of 50 nm to 1000 nm, and a difference in refractive index between the rubber particles and a cured article obtained from the optical semiconductor sealing resin composition falls within ±0.02.

(Rubber Particles)

The rubber particles for use in the present invention have a multilayer structure (core-shell structure) including a core having rubber elasticity (elastomeric core), and at least one shell layer covering the core. The rubber particles comprise a polymer containing one or more (meth)acrylic esters as essential monomeric components and have, in a surface layer thereof, a hydroxyl group and/or a carboxyl group as a functional group capable of reacting with the alicyclic epoxy resin. If the rubber particles have neither hydroxyl group nor carboxyl group in a surface layer thereof, the resulting cured article becomes cloudy upon thermal shock typically in temperature cycling and thereby has inferior transparency, thus being undesirable.

The polymer having rubber elasticity and constituting the core essentially contains, as constitutional monomeric components, one or more (meth)acrylic esters such as methyl (meth)acrylates, ethyl(meth)acrylates, and butyl(meth)acrylates. The polymer may further contain one or more monomeric components other than (meth)acrylic esters, and examples thereof include silicones such as dimethylsiloxane and phenylmethylsiloxane; aromatic vinyls such as styrene and α-methylstyrene; nitriles such as acrylonitrile and methacrylonitrile; conjugated dienes such as butadiene and isoprene; urethanes; ethylene; propylene; and isobutene.

In a preferred embodiment of the present invention, the elastomeric core contains one or more (meth)acrylic esters in combination with one or more constitutional monomeric components selected from the group consisting of silicones, aromatic vinyls, nitriles, and conjugated dienes. Examples of such preferred combinations include binary copolymers such as copoly((meth)acrylic ester/aromatic vinyl) and copoly ((meth)acrylic ester/conjugated diene); and ternary copolymers such as copoly((meth)acrylic ester/aromatic vinyl/conjugated diene).

The elastomeric core may further include one or more reactive crosslinking monomers each having two or more reactive functional groups per one monomer, in addition to the above-mentioned monomeric components. Such reactive crosslinking monomers correspond typically to divinylbenzene, allyl(meth)acrylates, ethylene glycol di(meth)acrylates, diallyl maleate, triallyl cyanurate, diallyl phthalate, and butylene glycol diacrylate.

The elastomeric core for use in the present invention preferably comprises a binary copolymer including, as monomeric components, a (meth)acrylic ester and an aromatic vinyl [copoly((meth)acrylic ester/aromatic vinyl)] and more preferably comprises a binary copolymer of copoly(butyl acrylate/styrene). This allows easy control of the refractive index of the rubber particles.

The elastomeric core can be produced according to customary processes such as a process of polymerizing the monomers through emulsion polymerization. The emulsion polymerization may be performed by charging and subjecting to polymerization the whole quantity of the monomers en block, or may be performed by polymerizing part of the monomers, and thereafter adding and subjecting to polymerization the remainder of the monomers continuously or intermittently. The emulsion polymerization may also adopt a polymerization technique using seed particles.

The shell layer preferably comprises a polymer different from the polymer constituting the core. The shell layer has a hydroxyl group and/or a carboxyl group as a functional group capable of reacting with the alicyclic epoxy resin. The shell layer having this configuration has higher adhesiveness at the interface with the alicyclic epoxy resin; and, the optical semiconductor sealing resin composition containing the rubber particles having the shell layer gives, through curing, a cured article having excellent cracking resistance and being transparent without cloudiness. In addition, the cured article is prevented from having a lower glass transition temperature.

The shell layer includes, as essential constitutional monomeric components, one or more (meth)acrylic esters such as methyl(meth)acrylates, ethyl(meth)acrylates, and butyl (meth)acrylates. Typically, when the (meth)acrylic ester constituting the core is butyl acrylate, the shell layer preferably includes one or more other (meth)acrylic esters than butyl acrylate, such as methyl(meth)acrylates, ethyl(meth)acrylates, and butyl methacrylate. The shell layer may further include other monomeric components in addition to (meth)acrylic esters, and examples thereof include aromatic vinyls such as styrene and α-methylstyrene; and nitriles such as acrylonitrile and methacrylonitrile. The shell layer in the present invention preferably includes, as constitutional monomeric components, one or more (meth)acrylic esters in combination with one or more of the above-mentioned other monomers, of which at least one aromatic vinyl is more preferably employed in combination with the one or more (meth)acrylic esters. This allows easy control of the refractive index of the rubber particles.

The shell layer more preferably includes one or more monomers corresponding to hydroxyalkyl(meth)acrylates such as 2-hydroxyethyl(meth)acrylates; α,β-unsaturated acids such as (meth)acrylic acids; and α,β-unsaturated acid anhydrides such as maleic anhydrides, as the monomeric component having a hydroxyl group and/or carboxyl group as a functional group capable of reacting with the alicyclic epoxy resin.

The shell layer for use in the present invention preferably includes, as constitutional monomeric components, one or more of the above-mentioned monomers in combination with the (meth)acrylic ester(s). Typically, the shell layer preferably comprises a ternary copolymer such as a copoly((meth)acrylic ester/aromatic vinyl/hydroxyalkyl(meth)acrylate) or a copoly((meth)acrylic ester/aromatic vinyl/α,β-unsaturated acid).

As with the core, the shell layer may further include one or more reactive crosslinking monomers each having two or more reactive functional groups per one monomer, in addition to the above-mentioned monomers. Examples of the reactive crosslinking monomers include divinylbenzenes, allyl(meth)acrylates, ethylene glycol di(meth)acrylates, diallyl maleate, triallyl cyanurate, diallyl phthalate, and butylene glycol diacrylate.

Exemplary techniques to cover the core with the shell layer include a technique of applying a copolymer for constituting the shell layer to a surface of the elastomeric core prepared by the above process to cover the core with the shell layer; and a technique of performing graft polymerization of the elastomeric core obtained by the process as a backbone component, and the respective components for constituting the shell layer as branch components.

The rubber particles for use in the present invention have an average particle diameter of about 10 to 500 nm and preferably about 20 to 400 nm. The rubber particles have a maximum particle diameter (largest particle diameter) of about 50 to 1000 nm and preferably about 100 to 800 nm. Rubber particles, if having an average particle diameter of more than 500 nm or if having a maximum particle diameter of more than 1000 nm, may often cause the cured article to have inferior transparency, and this may often cause the optical semiconductor device to show a lower luminous intensity. In contrast, rubber particles, if having an average particle diameter of less than 10 nm or if having a maximum particle diameter of less than 50 nm, may often cause the cured article to have insufficient cracking resistance.

The rubber particles for use in the present invention have a refractive index of typically about 1.40 to 1.60 and preferably about 1.42 to 1.58. The difference in refractive index between the rubber particles and the cured article, obtained by curing of the optical semiconductor sealing resin composition containing the rubber particles, is within ±0.02 and preferably within ±0.018. If the difference in refractive index is more than ±0.02, the cured article has inferior transparency and may become cloudy in some cases. This often causes the optical semiconductor to show a lower luminous intensity and may cause the optical semiconductor to lose their functions.

The refractive index of rubber particles can be determined, for example, by casting 1 gram of the rubber particles into a die; compression-molding the rubber particles at 210° C. and at 4 MPa to give a flat plate 1 mm thick; cutting a test piece 20 mm long and 6 mm wide from the obtained flat plate; and measuring a refractive index of the test piece at the sodium D line at 20° C. using a multi-wavelength Abbe refractometer (the product under the trade name "DR-M2", supplied by ATAGO Co., Ltd.) while keeping a prism and the test piece in intimate contact with each other using monobromonaphthalene as a contact liquid.

The refractive index of the cured article obtained from the optical semiconductor sealing resin composition can be determined, for example, by preparing a cured article by the thermal curing process described in the description about the optical semiconductor device; cutting a test piece 20 mm long, 6 mm wide, and 1 mm thick from the cured article; and measuring a refractive index of the test piece at the sodium D line at 20° C. using a multi-wavelength Abbe refractometer (the product under the trade name "DR-M2", supplied by ATAGO Co., Ltd.) while keeping a prism and the test piece in intimate contact with each other using monobromonaphthalene as a contact liquid.

(Alicyclic Epoxy Resin)

The alicyclic epoxy resin for use in the present invention is an alicyclic compound having an epoxy group composed of an oxygen atom, and adjacent two carbon atoms constituting its alicyclic ring, and can be arbitrarily chosen from among known or customary ones. The alicyclic epoxy resin for use in the present invention is preferably one being in liquid form at normal temperature (25° C.) from the viewpoint of workability in preparation and casting.

Of such alicyclic epoxy resins for use in the present invention, alicyclic epoxy resins represented by following Formula (1) are especially preferred from the points of high transparency and satisfactory thermal stability.

[Chem. 1]

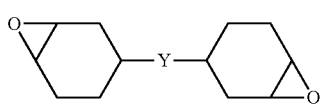

(1)

In Formula (1), Y represents a linkage group such as single bond, a bivalent hydrocarbon group, carbonyl group, ether bond, ester bond, amide bond, or a group composed of two or more of these bound to each other.

Exemplary bivalent hydrocarbon groups include linear or branched-chain alkylene groups having 1 to 18 carbon atoms; and bivalent alicyclic hydrocarbon groups. Examples of the linear or branched-chain alkylene groups having 1 to 18 include methylene, methylmethylene, dimethylmethylene, ethylene, propylene, and trimethylene groups. Examples of the bivalent alicyclic hydrocarbon groups include bivalent cycloalkylene groups (inclusive of cycloalkylidene groups), such as 1,2-cyclopentylene, 1,3-cyclopentylene, cyclopentylidene, 1,2-cyclohexylene, 1,3-cyclohexylene, 1,4-cyclohexylene, and cyclohexylidene groups.

Representative examples of the alicyclic epoxy resins represented by Formula (1) include compounds represented by following Formulae (1a) to (1j). In the following formulae, each of "n1" to "n8" independently denotes an integer of 1 to 30. In Formula (1e), —O—R—O— represents a diol residue. Examples of R include bivalent hydrocarbon groups; and bivalent groups each composed of two or more bivalent hydrocarbon groups bound to each other through one or more linkage groups such as ether bonds, ester bonds, amide bonds, and carbonyl groups. Exemplary bivalent hydrocarbon groups are as with the groups listed as the bivalent hydrocarbon group as Y.

[Chem. 2]

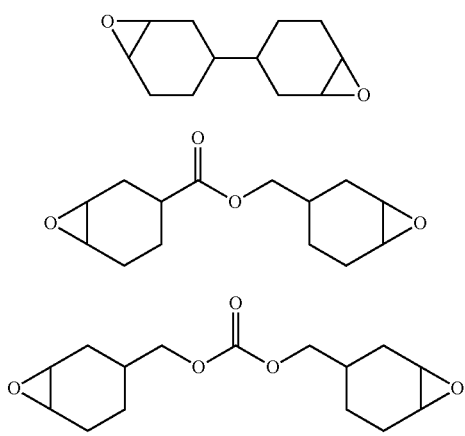

(1a)

(1b)

(1c)

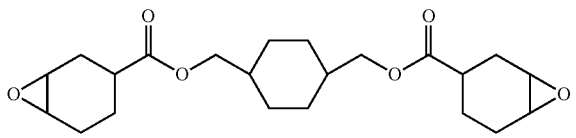

(1d)

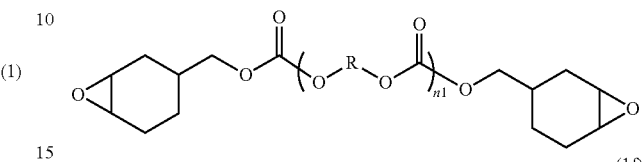

(1e)

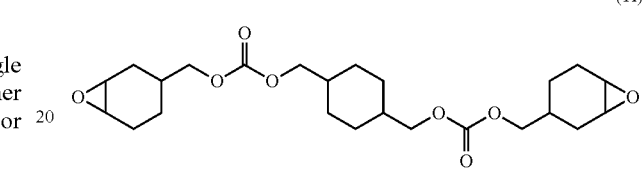

(1f)

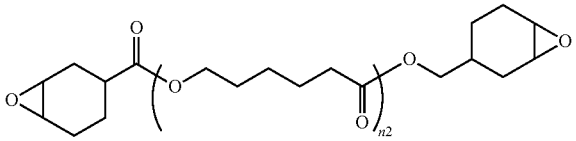

(1g)

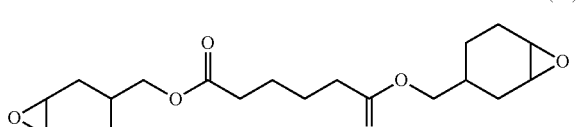

(1h)

[Chem. 3]

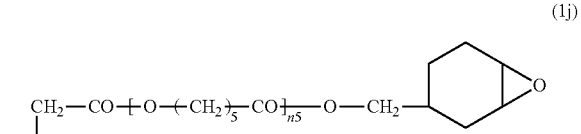

(1i)

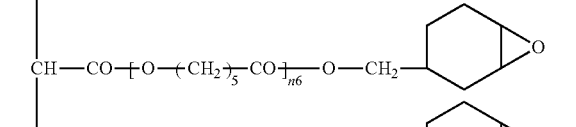

(1j)

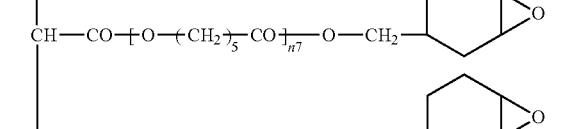

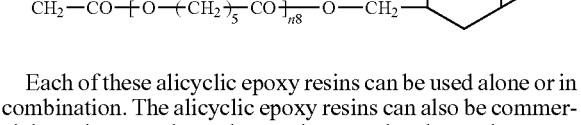

Each of these alicyclic epoxy resins can be used alone or in combination. The alicyclic epoxy resins can also be commercial products such as the products under the trade names "CELLOXIDE 2021P" and "CELLOXIDE 2081" (each supplied by Daicel Chemical Industries, Ltd.).

The rubber-particle-dispersed epoxy resin (A) in the present invention includes the alicyclic epoxy resin and, dispersed therein, the rubber particles. The amount of the rubber particles can be adjusted as appropriate according to necessity and is typically about 0.5 to 30 percent by weight and preferably about 1 to 20 percent by weight, relative to the total amount of the rubber-particle-dispersed epoxy resin (A). The rubber particles, if used in an amount of less than 0.5 percent by weight, may not provide sufficient cracking resistance. In contrast, the rubber particles, if used in an amount of more than 30 percent by weight, may adversely affect the thermal stability and transparency of the cured article.

The rubber-particle-dispersed epoxy resin (A) has a viscosity in terms of viscosity at 25° C. of preferably 400 mPa·s to 50000 mPa·s and especially preferably 500 mPa·s to 10000 mPa·s. The rubber-particle-dispersed epoxy resin (A), if having a viscosity (25° C.) of less than 400 mPa·s, may cause the cured article to have insufficient transparency. In contrast, the rubber-particle-dispersed epoxy resin (A), if having a viscosity (25° C.) of more than 50000 mPa·s, may adversely affect productivity both in the production of the rubber-particle-dispersed epoxy resin (A) and in the production of the optical semiconductor sealing resin composition.

The rubber-particle-dispersed epoxy resin (A) can have a controlled viscosity by using a reactive diluent. The reactive diluent is preferably an aliphatic polyglycidyl ether having a viscosity at normal temperature (25° C.) of 200 mPa·s or less. Examples of the aliphatic polyglycidyl ethers include cyclohexanedimethanol diglycidyl ether, cyclohexanediol diglycidyl ether, neopentyl glycol diglycidyl ether, 1,6-hexanediol diglycidyl ether, trimethylolpropane triglycidyl ether, and polypropylene glycol diglycidyl ethers.

The amount of the reactive diluent can be adjusted as appropriate and is typically about 30 parts by weight or less and preferably about 25 parts by weight or less (e.g., about 5 to 25 parts by weight) per 100 parts by weight of the rubber-particle-dispersed epoxy resin (A). The reactive diluent, if used in an amount of more than 30 parts by weight, may tend to prevent desired properties such as cracking resistance.

The rubber-particle-dispersed epoxy resin (A) for use in the present invention can be prepared according to any known or customary process not especially limited and can be prepared, for example, by dehydrating and drying the rubber particles to give a powder and blending and dispersing the powder into the alicyclic epoxy resin; or by directly blending and dehydrating a rubber particle emulsion and the alicyclic epoxy resin.

The rubber-particle-dispersed epoxy resin (A) is used in an amount of preferably about 30 to 100 percent by weight and more preferably about 50 to 100 percent by weight, based on the total amount of epoxy-containing resins in the optical semiconductor sealing resin composition. The rubber-particle-dispersed epoxy resin (A), if used in an amount of less than 30 percent by weight of the total epoxy-containing resins, may give a cured article having insufficient cracking resistance.

The optical semiconductor sealing resin composition according to the present invention includes at least the rubber-particle-dispersed epoxy resin (A). In a preferred embodiment, the composition includes three essential components, i.e., the rubber-particle-dispersed epoxy resin (A), a curing agent (B), and a curing accelerator (C). In another preferred embodiment, the composition includes two essential components, i.e., the rubber-particle-dispersed epoxy resin (A) and a curing catalyst (D).

[Curing Agent (B)]

The curing agent (B) has the function of curing a compound having one or more epoxy groups. The curing agent (B) for use in the present invention can be any of curing agents known or customarily used as curing agents for epoxy resins. Of such curing agents, the curing agent (B) in the present invention is preferably an acid anhydride which is in liquid form at 25° C., and examples thereof include methyltetrahydrophthalic anhydride, methylhexahydrophthalic anhydride, dodecenylsuccinic anhydride, and methyl-endomethylene tetrahydrophthalic anhydride. In the case of an acid anhydride which is in solid form at normal temperature (25° C.) (e.g., phthalic anhydride, tetrahydrophthalic anhydride, hexahydrophthalic anhydride, or methylcyclohexenedicarboxylic anhydride) can be used as the curing agent (B) in the present invention by dissolving the same in an acid anhydride which is in liquid form at normal temperature (25° C.) to form a liquid mixture.

The curing agent (B) in the present invention can also be any of commercial products such as the product under the trade name "Rikacid MH-700" (supplied by New Japan Chemical Co., Ltd.) and the product under the trade name "HN-5500" (Hitachi Chemical Co., Ltd.).

The curing agent (B) is used in an amount of typically about 50 to 150 parts by weight, preferably about 52 to 145 parts by weight, and especially preferably about 55 to 140 parts by weight, per 100 parts by weight of the total amount of epoxy-containing compounds in the optical semiconductor sealing resin composition. More specifically, the curing agent (B) is preferably used in an amount of 0.5 to 1.5 equivalents per 1 equivalent of epoxy groups in total epoxy-containing compounds in the optical semiconductor sealing resin composition. The curing agent (B), if used in an amount of less than 50 parts by weight, may not exhibit sufficient effects and may thereby cause the cured article to have insufficient toughness. In contrast, the curing agent (B), if used in an amount of more than 150 parts by weight, may cause the cured article to be colored and to have an inferior color (inferior hue).

[Curing Accelerator (C)]

The curing accelerator (C) is a compound having the function of speeding up the curing rate when an epoxy-containing compound is cured by the action of the curing agent (B). The curing accelerator (C) for use in the present invention can be any of known or customary curing accelerators, and examples thereof include 1,8-diazabicyclo[5.4.0]undecene-7 (DBU) and salts thereof such as phenol salt, octylic acid salt, p-toluenesulfonic acid salt, formic acid salt, and tetraphenylborate salt; 1,5-diazabicyclo[4.3.0]nonene-5 (DBN) and salts thereof such as phosphonium salt, sulfonium salt, quaternary ammonium salt, and iodonium salt; tertiary amines such as benzyldimethylamine, 2,4,6-tris(dimethylaminomethyl)phenol, and N,N-dimethylcyclohexylamine; imidazoles such as 2-ethyl-4-methylimidazole and 1-cyanoethyl-2-ethyl-4-methylimidazole; phosphoric esters, and phosphines such as triphenylphosphine; phosphonium compounds such as tetraphenylphosphonium tetra(p-tolyl)borate; organic metal salts such as tin octylate and zinc octylate; and metal chelates. Each of these can be used alone or in combination.

The curing accelerator (C) for use in the present invention can also be any of commercial products such as the products under the trade names "U-CAT SA 506", "U-CAT SA 102", "U-CAT 5003", "U-CAT 18X", and "12XD (development article)" (each supplied by SAN-APRO LIMITED), the products under the trade names "TPP-K" and "TPP-MK" (each supplied by Hokko Chemical Industry Co., Ltd.), and the product under the trade name "PX-4ET" (supplied by Nippon Chemical Industrial Co., Ltd.).

The curing accelerator (C) is used in an amount of typically about 0.05 to 5 parts by weight, preferably about 0.1 to 3 parts by weight, more preferably about 0.2 to 3 parts by weight, and most preferably about 0.25 to 2.5 parts by weight, per 100 parts by weight of the total amount of epoxy-containing compounds in the optical semiconductor sealing resin composition. The curing accelerator (C), if used in an amount of less than 0.05 parts by weight, may not sufficiently exhibit the curing acceleration effect. In contrast, the curing accelerator (C), if used in an amount of more than 5 parts by weight, may cause the cured article to be colored and to have an inferior color (hue).

[Curing Catalyst (D)]

The curing catalyst (D) in the present invention has the function of initiating the polymerization of epoxy compounds in the rubber-particle-dispersed epoxy resin (A). The curing catalyst (D) in the present invention is preferably a cationic-polymerization initiator that generates a cationic species through irradiation with an ultraviolet ray or a heating treatment and thereby initiates the polymerization of the rubber-particle-dispersed epoxy resin (A).

Exemplary cationic-polymerization initiators that generate a cationic species through irradiation with an ultraviolet ray include hexafluoroantimonate salts, pentafluorohydroxyantimonate salts, hexafluorophosphate salts, and hexafluoroarsenate salts, and preferred examples thereof include commercial products such as the product under the trade name "UVACURE 1590" (supplied by Daicel-Cytec Co., Ltd.), the products under the trade names "CD-1010", "CD-1011", and "CD-1012" (each supplied by Sartomer Company Inc., USA), the product under the trade name "IRGACURE 264" (supplied by Ciba Japan (now part of BASF Japan Ltd.)), and the product under the trade name "CIT-1682" (supplied by Nippon Soda Co., Ltd.).

Exemplary cationic-polymerization initiators that generate a cationic species through a heating treatment include aryldiazonium salts, aryliodonium salts, arylsulfonium salts, and allene-ion complexes; and preferred examples thereof include commercial products such as the products under the trade names "PP-33", "CP-66", and "CP-77" (each supplied by ADEKA CORPORATION), the product under the trade name "FC-509" (supplied by 3M Company), the product under the trade name "WE 1014" (supplied by G.E. (General Electric Co.)), the products under the trade names "San-Aid SI-60L", "San-Aid SI-80L", "San-Aid SI-100L", and "San-Aid SI-110L" (each supplied by Sanshin Chemical Industry Co., Ltd.), and the product under the trade name "CG-24-61" (supplied by Ciba Japan (now part of BASF Japan Ltd.)). Exemplary cationic-polymerization initiators that generate a cationic species through a heating treatment further include compounds between a chelate compound and a silanol (e.g., triphenylsilanol), which chelate compound is formed between a metal (e.g., aluminum or titanium) and acetoacetic acid or a diketone; and compounds between a chelate compound and a phenol (e.g., bisphenol-S), which chelate compound is formed between a metal (e.g., aluminum or titanium) and acetoacetic acid or a diketone.

Among them, hexafluorophosphate salts are preferred as the curing catalyst (D) for use in the present invention, because they have low toxicity, are easy to handle, and are versatile.

The curing catalyst (D) is used in an amount of typically about 0.01 to 15 parts by weight, preferably about 0.01 to 12 parts by weight, more preferably about 0.05 to 10 parts by weight, and most preferably about 0.1 to 10 parts by weight, per 100 parts by weight of the total amount of epoxy-containing compounds in the optical semiconductor sealing resin composition. The curing catalyst (D), when used in an amount within this range, can give a cured article excellent in thermal stability, transparency, and weather resistance.

The optical semiconductor sealing resin composition according to the present invention may further contain an alicyclic epoxy resin containing no rubber particles, in addition to the curing agent (B) and the curing accelerator (C), or the curing catalyst (D). Examples of the alicyclic epoxy resin include the alicyclic epoxy resins represented by Formula (1). The alicyclic epoxy resin containing no rubber particles is used in an amount of preferably less than 70 percent by weight, and more preferably less than 50 percent by weight, of the total amount of epoxy-containing resins in the optical semiconductor sealing resin composition. The alicyclic epoxy resin containing no rubber particles, if used in an amount of more than 70 percent by weight of the total amount of epoxy-containing resins, may tend to adversely affect the cracking resistance of the resulting cured article.

In addition, the optical semiconductor sealing resin composition according to the present invention may further contain other components such as aromatic-ring-containing glycidyl ether epoxides such as those of bisphenol-A and bisphenol-F types; glycidyl ether epoxides having no aromatic ring, such as those of hydrogenated bisphenol-A and aliphatic glycidyl types; glycidyl ester epoxides; glycidylamine epoxides; polyol compounds, oxetane compounds, and vinyl ether compounds.

The resin composition may further contain even an epoxy compound being in solid form at normal temperature (25° C.), as long as the epoxy compound becomes in liquid form after incorporated into the composition. Exemplary epoxy compounds being in solid form at normal temperature (25° C.) include solid bisphenol type epoxy compounds, novolak type epoxy compounds, glycidyl esters, triglycidyl isocyanurate, 1,2-epoxy-4-(2-oxiranyl)cyclohexane adducts of 2,2-bis (hydroxymethyl)-1-butanol (the product under the trade name "EHPE 3150", supplied by Daicel Chemical Industries, Ltd.). Each of such epoxy compounds can be used alone or in combination.

Among them, a glycidyl ether epoxide having no aromatic ring and/or polyol compound being in liquid form at 25° C. (other than polyether polyols) is preferably contained in the resin composition, in addition to the curing agent (B) and curing accelerator (C), or the curing catalyst (D), for further improving cracking resistance without loss of high thermal stability. Of such additional components, a glycidyl ether epoxide having no aromatic ring is more preferably contained in the resin composition, for further improving cracking resistance without loss of high thermal stability and light resistance.

[Glycidyl Ether Epoxide Having No Aromatic Ring]

Examples of the glycidyl ether epoxide having no aromatic ring for use in present invention include aliphatic glycidyl ether epoxides, and compounds corresponding to aromatic glycidyl ether epoxides, except for aromatic skeleton thereof being hydrogenated, and examples thereof usable herein include commercial products such as the products under the trade names "EPICLON 703", "EPICLON 707", "EPICLON 720", and "EPICLON 725" (each supplied by DIC Corporation), the products under the trade names "YH-300", "HY-315", YH-324", "PG-202", "PG-207", and "Suntohto ST-3000" (each supplied by Tohto Kasei Co., Ltd.), the products under the trade names "Rikaresin DME-100" and "Rikaresin HBE-100" (each supplied by New Japan Chemical Co., Ltd.), the products under the trade names "Denacol EX-212" and "Denacol EX-321" (each supplied by Nagase Chemtex Corporation), and the products under the trade names "YX8000" and "YX8034" (each supplied by Japan Epoxy Resins Co., Ltd. (now part of Mitsubishi Chemical Corporation)).

The glycidyl ether epoxide having no aromatic ring is used in an amount of typically about 10 to 60 parts by weight and preferably about 20 to 50 parts by weight per 100 parts by weight of the alicyclic epoxy resin.

[Polyol Compound Being in Liquid Form at 25° C.]

Examples of the polyol compound being in liquid form at 25° C. for use in the present invention include polyol compounds other than polyether polyols, such as polyester polyols and polycarbonate polyols.

Exemplary polyester polyols usable herein include commercial products such as the products under the trade names "PLACCEL 205", "PLACCEL 205H", "PLACCEL 205U", "PLACCEL 205BA", "PLACCEL 208", "PLACCEL 210", "PLACCEL 210CP", "PLACCEL 210BA", "PLACCEL 212", "PLACCEL 212CP", "PLACCEL 220", "PLACCEL 220CPB", "PLACCEL 220NP1", "PLACCEL 220BA", "PLACCEL 220ED", "PLACCEL 220EB", "PLACCEL 220EC", "PLACCEL 230", "PLACCEL 230CP", "PLACCEL 240", "PLACCEL 240CP", "PLACCEL 210N", "PLACCEL 220N", "PLACCEL L205AL", "PLACCEL L208AL", "PLACCEL L212AL", "PLACCEL L220AL", "PLACCEL L230AL", "PLACCEL 305", "PLACCEL 308", "PLACCEL 312", "PLACCEL L312AL", "PLACCEL 320", "PLACCEL L320AL", "PLACCEL L330AL", "PLACCEL 410", "PLACCEL 410D", "PLACCEL 610", "PLACCEL P3403", and "PLACCEL CDE9P" (each supplied by Daicel Chemical Industries, Ltd.).

Exemplary polycarbonate polyols usable herein include commercial products such as the products under the trade names "PLACCEL CD205PL", "PLACCEL CD205HL", "PLACCEL CD210PL", "PLACCEL CD21OHL", "PLACCEL CD220PL", and "PLACCEL CD22OHL" (each supplied by Daicel Chemical Industries, Ltd.), the products under the trade names "UH-CARB50", "UH-CARB100", "UH-CARB300", "UH-CARB90(1/3)", "UH-CARB90(1/1)", and "UC-CARB100" (each supplied by Ube Industries, Ltd.), the products under the trade names "PCDL T4671", "PCDL T4672", "PCDL T5650J", "PCDL T5651", and "PCDL T5652" (each supplied by Asahi Kasei Chemicals Corporation).

The polyol compound being in liquid form at 25° C. is used in an amount of typically about 5 to 50 parts by weight and preferably about 10 to 40 parts by weight, per 100 parts by weight of the rubber-particle-dispersed epoxy resin (A).

The optical semiconductor sealing resin composition according to the present invention can further contain a variety of additives within ranges not adversely affecting the advantageous effects of the present invention, in addition to the above-mentioned components.

The use of one or more hydroxyl-containing compounds such as ethylene glycol, diethylene glycol, propylene glycol, and glycerol as additives allows the reaction to proceed gradually. In addition, the resin composition can contain any customary additives such as silicone- or fluorine-containing defoaming agents, leveling agents, silane coupling agents (e.g., γ-glycidoxypropyltrimethoxysilane), surfactants, fillers, flame retardants, colorants, antioxidants, ultraviolet absorbers, ion adsorbents, pigments, and releasing agents, within ranges not adversely affecting viscosity or transparency. Such additives are used in an amount of about 5 percent by weight or less, based on the total amount of the optical semiconductor sealing resin composition.

The optical semiconductor sealing resin composition according to the present invention can be prepared by a known or customary process not specifically limited and can be prepared, for example, by blending predetermined amounts of the rubber-particle-dispersed epoxy resin (A), curing agent (B), curing accelerator (C), and arbitrary additives, or predetermined amounts of the rubber-particle-dispersed epoxy resin (A), curing catalyst (D), and arbitrary additives, and stirring and mixing them typically with a mixer (e.g., dissolver or homogenizer), a kneader, a roll, a bead mill, or a rotary and revolutionary stirring apparatus. The resulting mixture after stirring and mixing may be subjected to vacuum deaeration.

For better workability upon sealing of an optical semiconductor element, the optical semiconductor sealing resin composition according to the present invention is preferably in liquid form at normal temperature (25° C.); has a viscosity (25° C.) of preferably 20000 mPa·s or less (e.g., 200 to 20000 mPa·s), and more preferably 15000 mPa·s or less (e.g., 200 to 15000 mPa·s); and has a glass transition temperature of preferably 120° C. to 200° C. and more preferably 130° C. to 180° C.

The optical semiconductor sealing resin composition according to the present invention preferably gives, through curing, a cured article having excellent transparency. Accordingly, the cured article, when formed to have a thickness of 3 mm, preferably has a light transmittance of 72% or more at a wavelength of 400 nm and a light transmittance of 78% or more at a wavelength of 450 nm. The cured article, if having a light transmittance lower than the above range, may tend to lower the luminous intensity of an optical semiconductor device when used as a sealant for the optical semiconductor element.

The optical semiconductor sealing resin composition according to the present invention, when cured, forms a cured article which can exhibit excellent cracking resistance while maintaining satisfactory thermal stability and high transparency. The resin composition can therefore be advantageously used for sealing of an optical semiconductor element.

[Optical Semiconductor Device]

The optical semiconductor device according to the present invention includes one or more optical semiconductor elements sealed with the optical semiconductor sealing resin composition. The sealing of the optical semiconductor elements can be performed according to any known or customary process not limited, such as a potting, casting, or printing process.

Typically, according to the potting process, an optical semiconductor device including an optical semiconductor element sealed therein can be obtained by pouring the optical semiconductor sealing resin composition according to the present invention into a predetermined forming die, and thermally curing the resin composition. The thermal curing conditions can be adjusted as appropriate within the range of a heating temperature of about 80° C. to 200° C. (preferably 80° C. to 190° C., and more preferably 80° C. to 180° C.) and a heating time of about 30 to 600 minutes (preferably about 45 to 540 minutes, and more preferably about 60 to 480 minutes). Typically, the heating time is preferably shortened when the heating temperature is elevated. In contrast, the heating time is preferably prolonged when the heating temperature is lowered. The heating, if performed at a temperature and/or for a time lower or shorter than the above range, may cause insufficient curing. In contrast, the heating, if performed at a temperature and/or for a time higher or longer than the above range, may cause decomposition of the resin component(s). The thermal curing process may be performed in a single step, or in multiple steps in which multiple heating treatments are performed to cure the resin stepwise.

In the present invention, the thermal curing is preferably performed stepwise in which heating treatments are performed in multiple steps. This prevents foaming (bubbling) due to an abrupt curing reaction, relaxes the stress/strain caused by curing, and thereby improves cracking resistance of the cured article. When the curing agent (B) is used, the thermal curing is preferably performed by heating in a first step at a heating temperature of 80° C. to 150° C. (preferably 100° C. to 140° C.) for a heating time of 30 to 300 minutes (preferably 45 to 270 minutes) and thereafter heating in a second step at a heating temperature of 100° C. to 200° C. (preferably 110° C. to 180° C.) for a heating time of 30 to 600 minutes (preferably 45 to 540 minutes). When the curing catalyst (D) is used, the thermal curing is preferably performed by heating in a first step at a heating temperature of 30° C. to 150° C. (preferably 40° C. to 140° C.) for a heating time of 30 to 300 minutes (preferably 45 to 270 minutes) and thereafter heating in a second step at a heating temperature of 60° C. to 200° C. (preferably 80° C. to 180° C.) for a heating time of 30 to 600 minutes (preferably 45 to 540 minutes).

The optical semiconductor device according to the present invention includes one or more optical semiconductor elements sealed with the optical semiconductor sealing resin composition according to the present invention and can thereby maintain excellent luminous intensity over a long period of time. Accordingly, the optical semiconductor device keeps on maintaining high performance for a long time and establishes high credibility (reliability) as an extended-life optical semiconductor device.

EXAMPLES

The present invention will be illustrated in further detail with reference to several working examples below. It should be noted, however, that these examples are never construed to limit the scope of the present invention.

The average particle diameter and maximum particle diameter of rubber particles were measured in the following manner. A specimen as mentioned below was subjected to a measurement using the Nanotrac Particle Size Analyzer (the product under the trade name "UPA-EX150", supplied by Nikkiso Co., Ltd.) of the "Nanotrac™" system employing dynamic light scattering as a measurement principle, to give a particle size distribution curve; in the particle size distribution curve, the cumulative average diameter, which is the particle diameter at which the cumulative curve reaches 50, was defined as the average particle diameter, and the maximum (largest) particle diameter at which the frequency (%) of the measured particle size distribution exceeds 0.00% is defined as the maximum particle diameter.

Specimen:

The specimen was prepared by dispersing 1 part by weight of a rubber-particle-dispersed epoxy resin (A) in 20 parts by weight of tetrahydrofuran.

The refractive index of the rubber particles was measured by casting 1 g of the rubber particles into a die; compression-molding the rubber particles at 210° C., 4 MPa to give a flat plate 1 mm thick; cutting a test piece 20 mm long and 6 mm wide from the obtained flat plate; and measuring a refractive index of the test piece at the sodium D line at 20° C. using a multi-wavelength Abbe refractometer (the product under the trade name "DR-M2", supplied by ATAGO Co., Ltd.) while keeping a prism and the test piece in intimate contact with each other using monobromonaphthalene as a contact liquid.

The viscosity of each of rubber-particle-dispersed epoxy resins (A) prepared in the following production examples (each including 100 parts by weight of CELLOXIDE 2021P (supplied by Daicel Chemical Industries, Ltd.) and, dispersed therein, 5 parts by weight of rubber particles) was measured as a viscosity at 25° C. using a digital viscometer (the product under the trade name "Model DVU-EII", supplied by Tokimec, Inc.).

Production Example 1

In a 1-liter polymerization reactor equipped with a reflux condenser were placed 500 g of ion-exchanged water and 0.68 g of sodium dioctylsuccinate, the mixture was heated to 80° C. while stirring in a nitrogen stream, and combined with a monomer mixture added en block, in which the monomer mixture contained 9.5 g of butyl acrylate, 2.57 g of styrene, and 0.39 g of divinylbenzene, whose amounts corresponded to about 5 percent by weight of the amounts required to form a core. The resulting mixture was emulsified by stirring for 20 minutes, further combined with 9.5 mg of dipotassium peroxosulfate, stirred for 1 hour to perform a first seed polymerization, subsequently combined with 180.5 mg of dipotassium peroxosulfate, and stirred for 5 minutes. The mixture was further combined with another monomer mixture continuously added over 2 hours to perform a second seed polymerization, then aged for 1 hour, and thereby yielded the core. The other monomer mixture contained 180.5 g of butyl acrylate, 48.89 g of styrene, and 7.33 g of divinylbenzene, whose amounts corresponded to the remainder (about 95 percent by weight) of the amounts required to form the core, and further contained 0.95 g of sodium dioctylsuccinate dissolved therein.

Next, 60 mg of dipotassium peroxosulfate was added to the core, stirred for 5 minutes, combined with a monomer mixture continuously added over 30 minutes to perform a seed polymerization, aged for 1 hour, and thereby formed a shell layer covering the core. This monomer mixture contained 60 g of methyl methacrylate, 1.5 g of acrylic acid, and 0.3 g of allyl methacrylate, and further contained 0.3 g of sodium dioctylsuccinate dissolved therein.

Next, the resulting article was cooled to room temperature (25° C.), filtrated through a plastic mesh with an opening of 120 µm, and thereby yielded a latex containing particles having a core-shell structure. The resulting latex was frozen at minus 30° C., dehydrated and washed using a suction filter, dried through air blowing at 60° C. for a whole day and night, and thereby yielded rubber particles (1). The resulting rubber particles (1) had an average particle diameter of 254 nm, a maximum particle diameter of 486 nm, and a refractive index of 1.500.

In a nitrogen stream, 5 parts by weight of the above-prepared rubber particles (1) were dispersed in 100 parts by weight of CELLOXIDE 2021P (supplied by Daicel Chemical Industries, Ltd.) heated to 60° C., using a dissolver (at 1000 rpm for 60 minutes), subjected to vacuum deaeration, and thereby yielded a rubber-particle-dispersed epoxy resin (A-1) (viscosity at 25° C.: 559 mPa·s).

Production Example 2

Rubber particles (2) were prepared by the procedure of Production Example 1, except for using 2.7 g of 2-hydroxyethyl methacrylate instead of 1.5 g of acrylic acid. The prepared rubber particles (2) had an average particle diameter of 261 nm, a maximum particle diameter of 578 nm, and a refractive index of 1.500.

Next, using the rubber particles (2), a rubber-particle-dispersed epoxy resin (A-2) (viscosity at 25° C.: 512 mPa·s) was produced by the procedure of Production Example 1.

Production Example 3

In a 1-liter polymerization reactor equipped with a reflux condenser were placed 500 g of ion-exchanged water and 1.3 g of sodium dioctylsuccinate, the mixture was heated to 80° C. while stirring in a nitrogen stream, and combined with a monomer mixture added en block, in which the monomer mixture contained 9.5 g of butyl acrylate, 2.57 g of styrene, and 0.39 g of divinylbenzene, whose amounts corresponded to about 5 percent by weight of the amounts required to form a core. The resulting mixture was emulsified by stirring for 20 minutes, further combined with 12 mg of dipotassium peroxosulfate, stirred for 1 hour to perform a first seed polymerization, subsequently combined with 228 mg of dipotassium peroxosulfate, and stirred for 5 minutes. The mixture was further combined with another monomer mixture continuously added over 2 hours to perform a second seed polymerization, then aged for 1 hour, and thereby yielded the core. The other monomer mixture contained 180.5 g of butyl acrylate, 48.89 g of styrene, and 7.33 g of divinylbenzene, whose amounts corresponded to the remainder (about 95 percent by weight) of the amounts required to form the core, and further contained 1.2 g of sodium dioctylsuccinate dissolved therein.

Next, rubber particles (3) were prepared by the procedure of Production Example 1, except for using acrylic acid in an amount of 2.0 g instead of 1.5 g. The prepared rubber particles (3) had an average particle diameter of 108 nm, a maximum particle diameter of 289 nm, and a refractive index of 1.500.

Next, using the rubber particles (3), a rubber-particle-dispersed epoxy resin (A-3) (viscosity at 25° C.: 1036 mPa·s) was produced by the procedure of Production Example 1.

Production Example 4

Rubber particles (4) were prepared by the procedure of Production Example 1, except for using 1.0 g of styrene instead of 1.5 g of acrylic acid. The prepared rubber particles (4) had an average particle diameter of 257 nm, a maximum particle diameter of 578 nm, and a refractive index of 1.500.

Next, using the rubber particles (4), a rubber-particle-dispersed epoxy resin (A-4) (viscosity at 25° C.: 507 mPa·s) was produced by the procedure of Production Example 1.

Production Example 5

In a 1-liter polymerization reactor equipped with a reflux condenser were placed 500 g of ion-exchanged water and 0.35 g of sodium dioctylsuccinate, the mixture was heated to 80° C. while stirring in a nitrogen stream, and combined with a monomer mixture added en block, in which the monomer mixture contained 9.5 g of butyl acrylate and 0.29 g of divinylbenzene, whose amounts corresponded to about 5 percent by weight of the amounts required to form a core. The resulting mixture was emulsified by stirring for 20 minutes, further combined with 9.5 mg of dipotassium peroxosulfate, stirred for 1 hour to perform a first seed polymerization, subsequently further combined with 180.5 mg of dipotassium peroxosulfate, and stirred for 5 minutes. The mixture was further combined with another monomer mixture continuously added over 2 hours to perform a second seed polymerization, then aged for 1 hour, and thereby yielded the core. The other monomer mixture contained 180.5 g of butyl acrylate and 5.51 g of divinylbenzene, whose amounts corresponded to the remainder (about 95 percent by weight) of the amounts required to form the core, and further contained 1.5 g of sodium dioctylsuccinate dissolved therein.

Next, 75 mg of dipotassium peroxosulfate was added to the core, stirred for 5 minutes, combined with a monomer mixture added continuously over 30 minutes to perform a seed polymerization, aged for 1 hour, and thereby formed a shell layer covering the core. This monomer mixture contained 60 g of methyl methacrylate, 1.0 g of acrylic acid, and 0.3 g of allyl methacrylate, and further contained 0.2 g of sodium dioctylsuccinate dissolved therein.

Next, rubber particles (5) were prepared by the procedure of Production Example 1. Specifically, the above-prepared article was cooled to room temperature (25° C.), filtrated using a plastic mesh with an opening of 120 μm, and thereby yielded a latex containing particles having a core-shell structure. The resulting latex was frozen at minus 30° C., dehydrated and washed using a suction filter, dried through air blowing at 60° C. for a whole day and night, and thereby yielded the rubber particles (5). The prepared rubber particles (5) had an average particle diameter of 227 nm, a maximum particle diameter of 2312 nm, and a refractive index of 1.470.

Next, using the rubber particles (5), a rubber-particle-dispersed epoxy resin (A-5) (viscosity at 25° C.: 513 mPa·s) was produced by the procedure of Production Example 1.

Production Example 6

A rubber-particle-dispersed epoxy resin (A-6) (viscosity at 25° C.: 333 mPa·s) was produced by dispersing 5 parts by weight of particles (the product under the trade name "GENIOPERL P52", supplied by Wacker Asahikasei Silicone Co., Ltd.) in 100 parts by weight of CELLOXIDE 2021P (supplied by Daicel Chemical Industries, Ltd.) at room temperature (25° C.) using the product under the trade name "T.K. Minimixer" (supplied by Tokushu Kika Kogyo Co., Ltd. (now PRIMIX Corporation), at 6000 rpm for 40 minutes). The particles had a core composed of a low-modulus crosslinked silicone, and a shell layer composed of a methyl methacrylate polymer and had a refractive index at the sodium D line at 20° C. of 1.44, an average particle diameter of 282 nm, and a maximum particle diameter of 972 nm.

Examples 1 to 6 and Comparative Examples 1 to 8

A series of optical semiconductor resin compositions was prepared by uniformly blending respective components in the formulations (unit: part by weight) given in Tables 1 and 2 using a rotary and revolutionary mixer (the product under the trade name "AWATORIRENTARO (THINKY Mixer) AR-250", supplied by THINKY Corporation) at 2000 rpm for 5 minutes, followed by deaeration. The obtained optical semiconductor resin compositions were respectively cast into a die, heated, and thereby yielded a series of cured articles. In Examples 1 to 4 and Comparative Examples 1 to 6, the optical semiconductor resin compositions were heated at 100° C. for 2 hours and subsequently heated at 140° C. for 3 hours. In Examples 5 and 6, and Comparative Examples 7 and 8, the optical semiconductor resin compositions were heated at 80° C. for 3 hours, subsequently heated at 100° C. for 3 hours, and further subsequently heated at 140° C. for 3 hours.

TABLE 1

|  |  | Examples | | | |
| --- | --- | --- | --- | --- | --- |
|  |  | 1 | 2 | 3 | 4 |
| Rubber-particle-dispersed epoxy resin (A) | A-1 | 100 | | | |
|  | A-2 | | 100 | | |
|  | A-3 | | | 100 | 80 |
|  | A-4 | | | | |
|  | A-5 | | | | |
|  | A-6 | | | | |
| Rubber particles | Functional group | carboxyl group | hydroxyl group | carboxyl group | carboxyl group |
|  | Refractive index (%) | 1.5 | 1.5 | 1.5 | 1.5 |
|  | Average particle diameter (nm) | 254 | 261 | 108 | 108 |
|  | Maximum particle diameter (nm) | 486 | 578 | 289 | 289 |
|  | Viscosity of rubber-particle-dispersed resin (A) (mPa·s at 25°C.) | 559 | 512 | 1036 | 1036 |
| Epoxy resin | CELLOXIDE 2021P | | | | |
|  | YX8000 | | | | 20 |
|  | YH300 | | | | |
|  | YD8125 | | | | |
| Curing agent (B) | Rikacid MH-700 | 120 | 120 | 120 | 110 |
| Curing accelerator (C) | U-CAT SA-506 | 0.5 | 0.5 | 0.5 | 0.5 |
| Curing catalyst (D) | San-Aid SI-100L | | | | |
| Additive | Ethylene glycol | 1 | 1 | 1 | 1 |
| Cured article | Refractive index (%) | 1.505 | 1.505 | 1.505 | 1.503 |
|  | Difference in refractive Index from rubber particles | 0.005 | 0.005 | 0.005 | 0.003 |
|  | Glass transition temperature (°C.) | 181 | 179 | 179 | 171 |
| Appearance of cured article | Immediately after curing | Passed | Passed | Passed | Passed |
|  | After thermal shock test | Passed | Passed | Passed | Passed |
| Light transmittance (%) | 450 nm | 88 | 87 | 90 | 90 |
|  | 400 nm | 85 | 85 | 87 | 86 |
| Thermal shock test | Number of cracked specimens | Passed | Passed | Passed | Passed |
|  | Lengths of cracks | Passed | Passed | Passed | Passed |
|  | lit/unlit | Passed | Passed | Passed | Passed |
| Synthetic judgment |  | Passed | Passed | Passed | Passed |

TABLE 2

|  |  | Comparative Examples | | | | | |
| --- | --- | --- | --- | --- | --- | --- | --- |
|  |  | 1 | 2 | 3 | 4 | 5 | 6 |
| Rubber-particle-dispersed epoxy resin (A) | A-1 | | | | | 25 | |
|  | A-2 | | | | | | |
|  | A-3 | | | | | | |
|  | A-4 | | | 100 | | | |
|  | A-5 | | | | 100 | | |
|  | A-6 | | | | | | 100 |
| Rubber particles | Functional group | | | none | carboxyl group | carboxyl group | none |
|  | Refractive index (%) | | | 1.5 | 1.47 | 1.5 | 1.44 |
|  | Average particle diameter (nm) | | | 257 | 227 | 254 | 282 |
|  | Maximum particle diameter (nm) | | | 578 | 2312 | 486 | 972 |
|  | Viscosity of rubber-particle-dispersed resin (A) (mPa·s at 25°C.) | | | 507 | 513 | 559 | 333 |
| Epoxy resin | CELLOXIDE 2021P | 100 | | | | | |
|  | YX8000 | | 100 | | | | |
|  | YH300 | | | | | | |
|  | YD8125 | | | | | 75 | |
| Curing agent (B) | Rikacid MH-700 | 130 | 80 | 120 | 120 | 100 | 120 |
| Curing accelerator (C) | U-CAT SA-506 | 0.5 | 0.5 | 0.5 | 0.5 | 0.5 | 0.5 |
| Curing catalyst (D) | San-Aid SI-100L | | | | | | |
| Additive | Ethylene glycol | 1 | 1 | 1 | 1 | 1 | 1 |
| Cured article | Refractive index (%) | 1.504 | 1.505 | 1.505 | un-measurable | 1.531 | un-measurable |
|  | Difference in refractive index from rubber particles | | | 0.005 | (0.034) | 0.031 | (0.064) |
|  | Glass transition temperature (°C.) | 181 | 99 | 175 | 177 | 142 | 180 |
| Appearance of cured article | Immediately after curing | Passed | Passed | Passed | Failed (cloudy) | Passed | Failed (cloudy) |

TABLE 2-continued

|  |  | Comparative Examples | | | | | |
|---|---|---|---|---|---|---|---|
|  |  | 1 | 2 | 3 | 4 | 5 | 6 |
|  | After thermal shock test | Passed | Passed | Failed (cloudy) | — | Passed | — |
| Light transmittance (%) | 450 nm | 91 | 91 | 89 | 29 | 77 | 22 |
|  | 400 nm | 89 | 88 | 86 | 26 | 69 | 15 |
| Thermal shock test | Number of cracked specimens | Failed | Passed | Failed (cloudy) | — | Passed | — |
|  | Lengths of cracks | Failed | Passed | — | — | Failed | — |
|  | lit/unlit | Passed | Failed | — | — | Passed | — |
| Synthetic judgment |  | Failed | Failed | Failed | Failed | Failed | Failed |

TABLE 3

|  |  | Examples | | Comparative Examples | |
|---|---|---|---|---|---|
|  |  | 5 | 6 | 7 | 8 |
| Rubber-particle-dispersed epoxy resin (A) | A-1 | 70 | | | |
|  | A-2 | | | | |
|  | A-3 | | 70 | | |
|  | A-4 | | | | |
|  | A-5 | | | | 33 |
|  | A-6 | | | | |
| Rubber particles | Functional group | carboxyl group | carboxyl group | | carboxyl group |
|  | Refractive index (%) | 1.5 | 1.5 | | 1.47 |
|  | Average particle diameter (nm) | 254 | 108 | | 227 |
|  | Maximum particle diameter (nm) | 486 | 289 | | 2312 |
| Viscosity of rubber-particle-dispersed resin (A) (mPa·s at 25° C.) |  | 559 | 1036 | | 513 |
| Epoxy resin | CELLOXIDE 2021P | | | 70 | 37 |
|  | YX8000 | 25 | 25 | 25 | 25 |
|  | YH300 | 5 | 5 | 5 | 5 |
|  | YD8125 | | | | |
| Curing agent (B) | Rikacid MH-700 | | | | |
| Curing accelerator (C) | U-CAT SA-506 | | | | |
| Curing catalyst (D) | San-Aid SI-100L | 0.5 | 0.5 | 0.5 | 0.5 |
| Additive | Ethylene glycol | | | | |
| Cured article | Refractive index (%) | 1.516 | 1.519 | 1.516 | unmeasurable |
|  | Difference in refractive index from rubber particles | 0.016 | 0.019 | — | (0.046) |
|  | Glass transition temperature (° C.) | 126 | 130 | 145 | 139 |
| Appearance of cured article | Immediately after curing | Passed | Passed | Passed | Failed (cloudy) |
|  | After thermal shock test | Passed | Passed | Passed | — |
| Light transmittance (%) | 450 nm | 80 | 89 | 89 | 33 |
|  | 400 nm | 75 | 85 | 82 | 26 |
| Thermal shock test | Number of cracked specimens | Failed | Failed | Failed | — |
|  | Lengths of cracks | Passed | Passed | Failed | — |
|  | lit/unlit | Passed | Passed | Passed | — |
| Synthetic judgment |  | Passed | Passed | Failed | Failed |

In the tables, the symbol "-" indicates that neither measurement nor evaluation was performed.

*Epoxy Resin

CELLOXIDE 2021P: 3,4-Epoxycyclohexenylmethyl 3',4'-epoxycyclohexenecarboxylate, supplied by Daicel Chemical. Industries, Ltd.

YX8000: Epoxy resin mainly containing diglycidyl ether of hydrogenated bisphenol-A, the product under the trade name "EPIKOTE (now jER) YX8000", supplied by Japan Epoxy Resins Co., Ltd. (now part of Mitsubishi Chemical Corporation)

YH300: Low-viscosity epoxy resin mainly containing an aliphatic polyglycidyl ether, supplied by Tohto Kasei Co., Ltd.

YD8125: Bisphenol-A type epoxy resin, supplied by Tohto Kasei Co., Ltd.

Curing Agent (B)

Rikacid MH-700: 70:30 mixture of 4-methylhexahydrophthalic anhydride and hexahydrophthalic anhydride, supplied by New Japan Chemical Co., Ltd.

Curing Accelerator (C)

U-CAT SA-506: DBU-p-toluenesulfonic acid salt, supplied by SAN-APRO LIMITED

Curing Catalyst (D)

San-Aid SI-100L: Arylsulfonium salt, supplied by Sanshin Chemical Industry Co., Ltd.

Additive

Ethylene glycol: Product supplied by Wako Pure Chemical Industries Ltd.

The prepared cured articles were evaluated according to the following methods.

[Appearance of Cured Article]

(Immediately After Curing)

Sample cured articles 3 mm thick were visually observed on whether or not the cured articles suffered from deterioration in hue, cloudiness, and bleedout of the rubber particles, and the appearances of the cured articles were evaluated according to the following criteria.

(After 100 Cycles of Thermal Shock Test)

The cured articles after subjected to 100 cycles of a thermal shock test were visually observed on whether or not the cured article suffered from deterioration in hue, cloudiness, and bleedout of the rubber particles, as compared to the cured articles before the thermal shock test. The appearances of the cured articles after 100 cycles of the thermal shock test were evaluated according to the following criteria.

Evaluation Criteria:

The cured article suffered from none of deterioration in hue, cloudiness, and bleedout of the rubber particles: Passed The cured article suffered from at least one of deterioration in hue, cloudiness, and bleedout of the rubber particles: Failed

[Refractive Index Difference Check]

The refractive indices of the cured articles were measured by cutting test pieces each 20 mm long, 6 mm wide, and 1 mm thick from the above-obtained cured articles; and measuring refractive indices of the test pieces at the sodium D line at 20° C. using a multi-wavelength Abbe refractometer (the product under the trade name "DR-M2", supplied by ATAGO Co., Ltd.) while keeping a prism and the test piece in intimate contact with each other using monobromonaphthalene as a contact liquid. Next, differences in refractive index were calculated according to the equation below. The cured articles prepared in Comparative Examples 4, 6, and 8 became cloudy, and their refractive indices were unmeasurable. Accordingly, the cured articles produced in Comparative Examples 4 and 6 were assumed to each have a refractive index as with the refractive index (1.504) of the cured article produced in Comparative Example 1; and the cured article produced in Comparative Example 8 was assumed to have a refractive index as with the refractive index (1.516) of the cured article produced in Comparative Example 7.

Difference in refractive index=[Refractive index of rubber particles]−[Refractive index of cured article]

[Glass Transition Temperature]

Test pieces 5 mm long, 5 mm wide, and 3.5 mm thick were cut from the above-prepared cured articles and subjected to a thermo-mechanical analysis (TMA) performed from room temperature (25° C.) to 300° C. at a rate of temperature rise of 5° C. per minute, and glass transition temperatures (Tg, ° C.) of the test pieces were measured as an index of thermal stability. A thermo-mechanical analyzer used herein was the product under the trade name "EXSTAR 6000" (supplied by Seiko Instruments Inc.).

[Light Transmittance]

Test pieces 3 mm thick were sliced from the above-prepared cured articles, and light transmittances (%) of the test pieces at wavelengths of 400 nm and 450 nm were measured using a spectrophotometer (the product under the trade name "UV-2450", supplied by Shimadzu Corporation).

[Thermal Shock Test]

Optical semiconductor devices (five specimens per each optical semiconductor resin composition) were prepared by casting each of the above-prepared optical semiconductor resin compositions into a lead frame with an optical semiconductor element and thermally curing the resin composition. After checking that all the prepared optical semiconductor devices were free from cracking, the optical semiconductor devices were subjected to repeated 100 cycles of a thermal shock test using a thermal shock tester (the product under the trade name "TSE-11-A", supplied by ESPEC Corporation). In one cycle, the optical semiconductor devices were exposed to 105° C. for 30 minutes and then exposed to minus 45° C. for 30 minutes. The optical semiconductor devices after 100 cycles of the thermal shock test were observed on the number of cracked specimens and the lengths of cracks using a digital microscope (the product under the trade name "VHX-900", supplied by Keyence Corporation); the number of cracked specimens was evaluated according to the following criteria; and, when one or more cracks were formed, the lengths of the cracks were evaluated according to the following criteria.

Evaluation Criteria for Number of Cracked Specimens:

Two or less of the five optical semiconductor devices suffered from cracking: Passed Three or more of the five optical semiconductor devices suffered from cracking: Failed Evaluation Criteria for Lengths of Cracks:

All the formed cracks had lengths of 140 µm or less: Passed

All the formed cracks had lengths of more than 140 µm: Failed

In addition, the optical semiconductor devices after 100 cycles of the thermal shock test were visually observed on whether or not they were lit, and evaluations were performed according to the following criteria.

Evaluation Criteria:

All the five optical semiconductor devices were lit: Passed

At least one of the five optical semiconductor devices was unlit: Failed

[Synthetic Judgment]

In the samples using the curing agent (B) (Examples 1 to 4 and Comparative Examples 1 to 6), a sample satisfying all the following conditions was synthetically judged as "Passed", and a sample not satisfying at least one of the following conditions was synthetically judged as "Failed":

Appearances of the sample cured article immediately after curing and after 100 cycles of the thermal shock test were both evaluated as Passed;

The cured article had a glass transition temperature (Tg) of 120° C. or higher;

The cured article had a light transmittance at 450 nm of 78% or more;

The cured article had a light transmittance at 400 nm of 72% or more; and

The number of cracked specimens and lit/unlit of the cured articles after 100 cycles of the thermal shock test were both evaluated as Passed.

In the samples using the curing catalyst (D) (Examples 5 and 6, and Comparative Examples 7 and 8), a sample satisfying all the following conditions was synthetically judged as "Passed", and a sample not satisfying at least one of the following conditions was synthetically judged as "Failed":

Appearances of the sample cured article immediately after curing and after 100 cycles of the thermal shock test were both evaluated as Passed;

The cured article had a glass transition temperature (Tg) of 120° C. or higher;

The cured article had a light transmittance at 450 nm of 78% or more;

The cured article had a light transmittance at 400 nm of 72% or more; and

The number of cracked specimens and lit/unlit of the cured articles after 100 cycles of the thermal shock test were both evaluated as Passed.

Industrial Applicability

The optical semiconductor sealing resin compositions according to the present invention are advantageously usable in a wide variety of applications including uses as sealing materials for electric and electronic components relating to optical semiconductor devices. In particular, when the optical semiconductor sealing resin compositions are used as sealants for optical semiconductor devices, the resulting optical semiconductor devices keep on maintaining high performance for a long time and establish high credibility (reliability) as extended-life optical semiconductor devices.

The invention claimed is:

1. An optical semiconductor sealing resin composition comprising:
   a rubber-particle-dispersed epoxy resin (A) containing an alicyclic epoxy resin and, dispersed therein,
   rubber particles;
   wherein the rubber particles have a multilayer structure comprising a core and at least one shell layer covering the core,
   wherein a polymer constituting the core contains, as constitutional monomeric components,
   (i) one or more (meth)acrylic esters,
   (ii) one or more aromatic vinyls, and
   (iii) one or more reactive crosslinking monomers each having two or more reactive functional groups per one monomer, and
   wherein the shell layer includes, as constitutional monomeric components,
   (i) one or more (meth)acrylic esters,
   (ii) a monomeric component having a hydroxyl group or carboxyl group, and
   (iii) one or more reactive crosslinking monomers each having two or more reactive functional groups per one monomer,
   wherein the reactive crosslinking monomers include divinylbenzenes, allyl (meth)acrylates, ethylene glycol di(meth)acrylates, diallyl maleate, triallyl cyanurate, diallyl phthalate, and butylene glycol diacrylate, and
   wherein the hydroxyl group and/or carboxyl group is a functional group capable of reacting with the alicyclic epoxy resin;
   wherein the rubber particles have an average particle diameter of 10 nm to 500 nm and a maximum particle diameter of 50 nm to 1000 nm;
   wherein a difference in refractive index between the rubber particles and a cured article obtained from the optical semiconductor sealing resin composition falls within ±0.02;
   wherein the rubber-particle-dispersed epoxy resin (A) is present in an amount of 50 to 100 percent by weight based on a total amount of epoxy-containing resins in the composition; and
   wherein the rubber-particle-dispersed epoxy resin (A) is prepared by dehydrating and drying the rubber particles to produce a powder, and blending and dispersing the powder into the alicyclic epoxy resin.

2. The optical semiconductor sealing resin composition according to claim 1, further comprising a curing agent (B) and a curing accelerator (C), in addition to the rubber-particle-dispersed epoxy resin (A).

3. The optical semiconductor sealing resin composition according to claim 1, further comprising a curing catalyst (D) in addition to the rubber-particle-dispersed epoxy resin (A).

4. The optical semiconductor sealing resin composition according to claim 2, wherein the curing agent (B) is an acid anhydride which is in liquid form at 25° C.

5. The optical semiconductor sealing resin composition according to claim 3, wherein the curing catalyst (D) generates a cationic species upon irradiation with an ultraviolet ray or upon a heating treatment and thereby initiates polymerization of the rubber-particle-dispersed epoxy resin (A).

6. The optical semiconductor sealing resin composition according to any one of claims 1 to 5, further comprising a glycidyl ether epoxide having no aromatic ring and/or a polyol compound which is in liquid form at 25° C. (except polyether polyols).

7. An optical semiconductor device comprising one or more optical semiconductor elements sealed with the optical semiconductor sealing resin composition as claimed in claim 1.

8. An optical semiconductor sealing resin composition comprising:
   a rubber-particle-dispersed epoxy resin (A) containing an alicyclic epoxy resin and, dispersed therein,
   rubber particles;
   wherein the rubber particles have a multilayer structure comprising a core and at least one shell layer covering the core,
   wherein a polymer constituting the core contains, as constitutional monomeric components,
   (i) one or more (meth)acrylic esters,
   (ii) one or more aromatic vinyls, and
   (iii) one or more reactive crosslinking monomers each having two or more reactive functional groups per one monomer, and
   wherein the shell layer includes, as constitutional monomeric components,
   (i) one or more (meth)acrylic esters,
   (ii) a monomeric component having a hydroxyl group or carboxyl group, and
   (iii) one or more reactive crosslinking monomers each having two or more reactive functional groups per one monomer,
   wherein the reactive crosslinking monomers include divinylbenzenes, allyl (meth)acrylates, ethylene glycol di(meth)acrylates, diallyl maleate, triallyl cyanurate, diallyl phthalate, and butylene glycol diacrylate, and
   wherein the hydroxyl group and/or carboxyl group is a functional group capable of reacting with the alicyclic epoxy resin
   wherein the rubber particles have an average particle diameter of 10 nm to 500 nm and a maximum particle diameter of 50 nm to 1000 nm;
   wherein a difference in refractive index between the rubber particles and a cured article obtained from the optical semiconductor sealing resin composition falls within ±0.02;
   wherein the rubber-particle-dispersed epoxy resin (A) is present in an amount of 50 to 100 percent by weight based on a total amount of epoxy-containing resins in the composition;
   wherein the rubber-particle-dispersed epoxy resin (A) is prepared by dehydrating and drying the rubber particles to produce a powder, and blending and dispersing the powder into the alicyclic epoxy resin;
   wherein the optical semiconductor sealing resin composition, further comprising a curing agent (B) and a curing accelerator (C), in addition to the rubber-particle-dispersed epoxy resin (A); and wherein the curing agent (B) is an acid anhydride which is in liquid form at 25° C.

* * * * *